(12) United States Patent
Melendrez et al.

(10) Patent No.: US 11,616,045 B2
(45) Date of Patent: Mar. 28, 2023

(54) METHODS AND APPARATUSES FOR REMOVAL OF WIRES FROM PACKAGING SUBSTRATES

(71) Applicant: SKYWORKS SOLUTIONS, INC., Woburn, MA (US)

(72) Inventors: Cesar Melendrez, Mexicali (MX); Miguel Camargo Soto, Mexicali (MX); Aldrin Quinones Garing, Mexicali (MX)

(73) Assignee: Skyworks Solutions, Inc., Irvine, CA (US)

( * ) Notice: Subject to any disclaimer, the term of this patent is extended or adjusted under 35 U.S.C. 154(b) by 176 days.

(21) Appl. No.: 16/583,007

(22) Filed: Sep. 25, 2019

(65) Prior Publication Data
US 2020/0105717 A1  Apr. 2, 2020

Related U.S. Application Data
(60) Provisional application No. 62/737,594, filed on Sep. 27, 2018.

(51) Int. Cl.
*H01L 23/00* (2006.01)
(52) U.S. Cl.
CPC ............ *H01L 24/98* (2013.01); *H01L 24/799* (2013.01)
(58) Field of Classification Search
CPC combination set(s) only.
See application file for complete search history.

(56) References Cited

U.S. PATENT DOCUMENTS

| | | | | |
|---|---|---|---|---|
| 5,355,755 A | * | 10/1994 | Sakata | B24B 1/04 451/165 |
| 5,425,833 A | * | 6/1995 | Fujimoto | H01L 24/83 156/765 |
| 7,268,421 B1 | * | 9/2007 | Lin | H01L 24/90 257/690 |
| 2004/0230383 A1 | * | 11/2004 | Bechhoefer | G01R 31/11 702/57 |
| 2006/0070922 A1 | * | 4/2006 | LaVeine | B29B 17/02 209/223.1 |
| 2016/0079198 A1 | * | 3/2016 | Lin | B23K 20/007 228/180.5 |

FOREIGN PATENT DOCUMENTS

JP         360056803 A  *  4/1985  ............... B23B 5/12

* cited by examiner

*Primary Examiner* — Caridad Everhart
(74) *Attorney, Agent, or Firm* — Chang & Hale LLP

(57) ABSTRACT

Wire removal systems and methods for packaging applications. In some embodiments, a method of manufacturing a module can include receiving by an automated wire cutting apparatus a packaging substrate including a die mounted thereon and a defective wire coupled thereto, positioning one or both of a wire cutting instrument of the automated wire cutting apparatus and the packaging substrate relative to the other based on predetermined instructions, and detaching the defective wire from the packaging substrate using the wire cutting instrument.

18 Claims, 10 Drawing Sheets

```
                    ┌─────────────────────────────────────────────┐
                    │    RECEIVE A PACKAGING SUBSTRATE HAVING A DIE│──202
200                 │  MOUNTED THEREON AND A TARGET WIRE COUPLED THERETO│
                    └─────────────────────────────────────────────┘
                                          │
                                          ▼
                    ┌─────────────────────────────────────────────┐
                    │  MOVE ONE OR BOTH OF A WIRE CUTTING INSTRUMENT AND THE│──204
                    │  PACKAGING SUBSTRATE RELATIVE TO THE OTHER BASED ON   │
                    │  PREDETERMINED INSTRUCTIONS TO EFFECT MECHANICAL      │
                    │  SEPARATION OF THE TARGET WIRE FROM THE PACKAGING     │
                    │  SUBSTRATE USING THE WIRE CUTTING INSTRUMENT          │
                    └─────────────────────────────────────────────┘
```

FIG.2

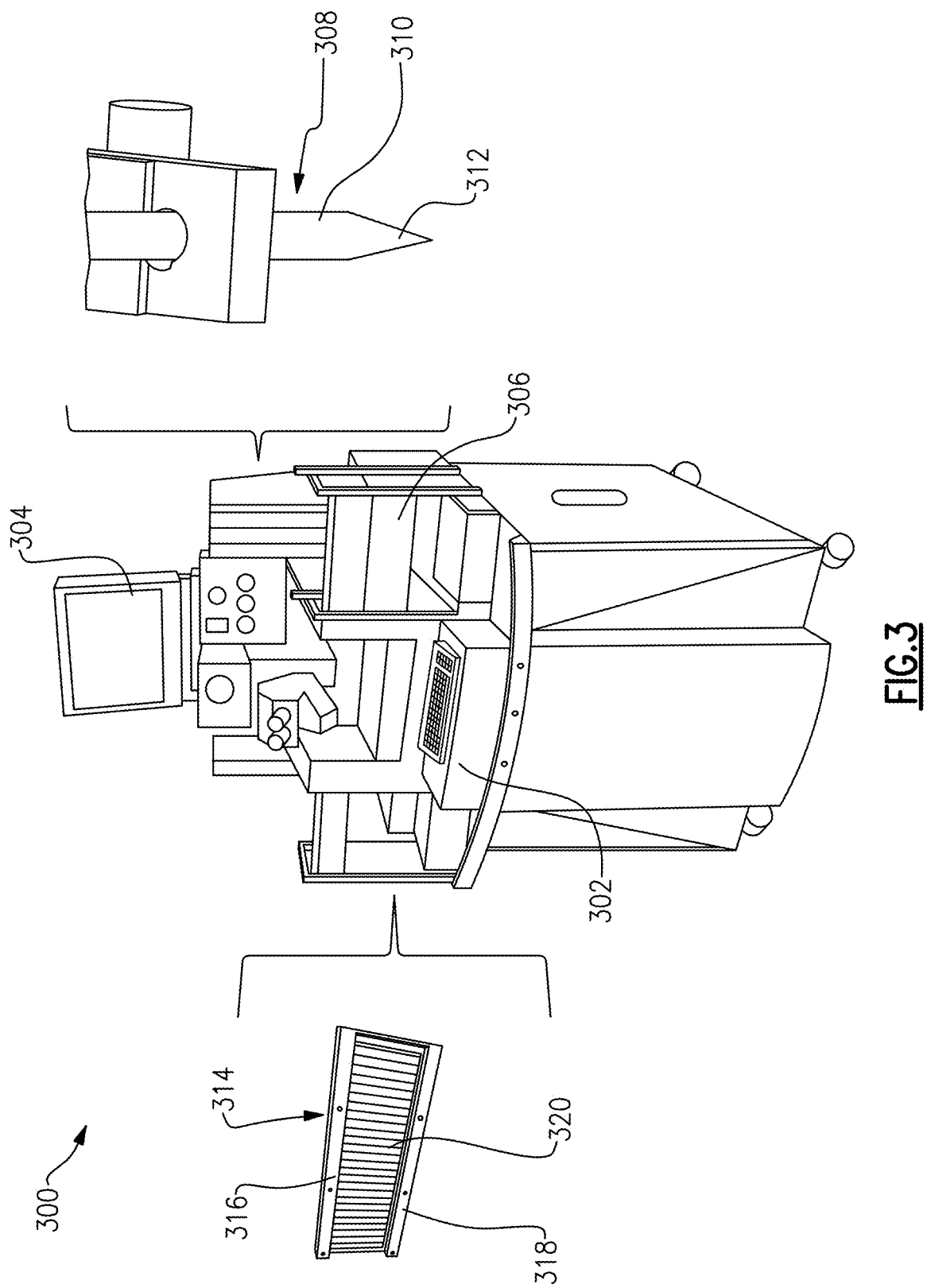

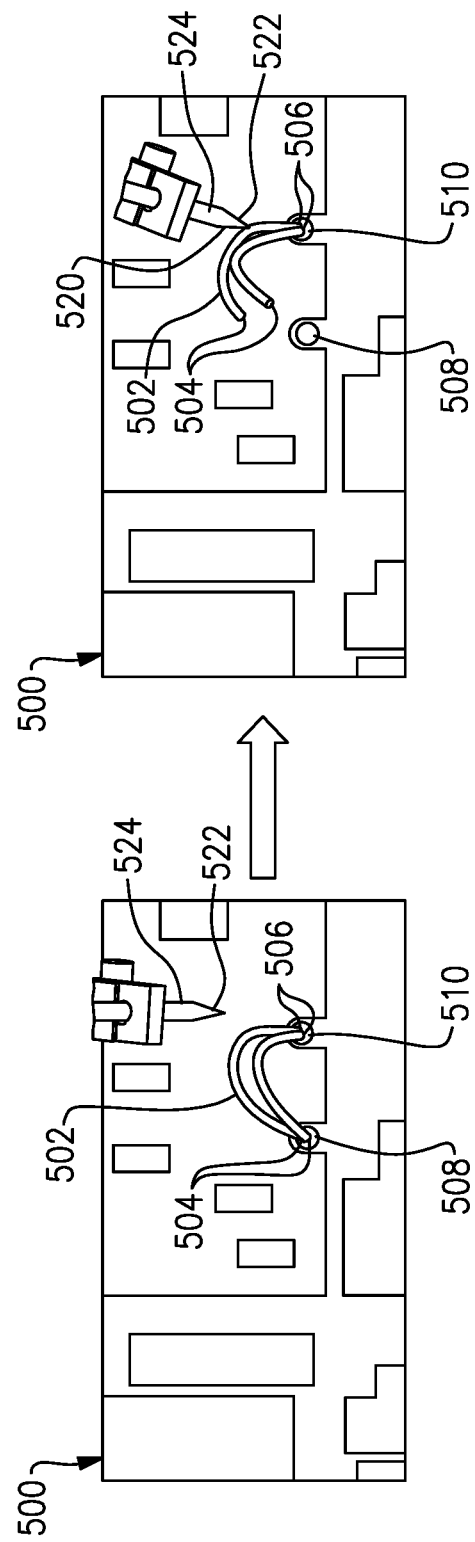

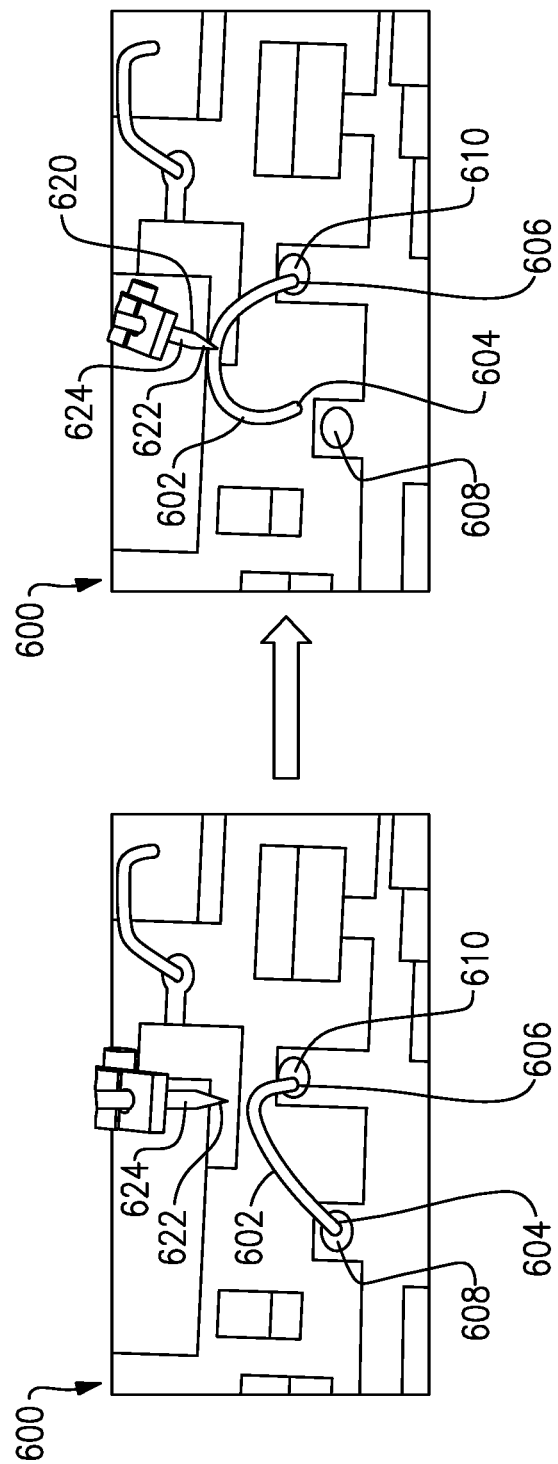

METHODS AND APPARATUSES FOR REMOVAL OF WIRES FROM PACKAGING SUBSTRATES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application claims priority to U.S. Provisional Application No. 62/737,594 filed Sep. 27, 2018, entitled METHODS AND APPARATUSES FOR REMOVAL OF DEFECTIVE WIRES, the disclosure of which is hereby expressly incorporated by reference herein in its respective entirety.

BACKGROUND

Field

The present disclosure relates to electronic device fabrication, such as removal of electrical wires from packaging substrates used in electronic device fabrication.

Description of the Related Art

Electrical wires can be bonded to packaging substrates to provide desired electrical communication. The packaging substrates can be configured for use in a variety of electronic applications, including mobile electronic applications. For example, the packaging substrates can be configured for use in radio-frequency (RF) applications, including mobile RF applications.

SUMMARY

In accordance with a number of implementations, the present disclosure relates to a method of manufacturing a module. The method includes receiving by an automated wire cutting apparatus a packaging substrate including a die mounted thereon and a defective wire coupled thereto. The method further includes positioning one or both of a wire cutting instrument of the automated wire cutting apparatus and the packaging substrate relative to the other based on predetermined instructions, and detaching the defective wire from the packaging substrate using the wire cutting instrument.

In some embodiments, the predetermined instructions can be based at least in part on a pattern of defective wires coupled to the packaging substrate. In some embodiments, the method can further include selecting by the automated wire cutting apparatus the predetermined instructions based at least in part on a pattern of defective wires coupled to the packaging substrate.

In some embodiments, positioning one or both of the wire cutting instrument and the packaging substrate includes moving the wire cutting instrument relative to the packaging substrate.

In some embodiments, detaching the defective wire from the packaging substrate can include contacting the wire cutting instrument and the defective wire.

In some embodiments, the method can further include removing the detached defective wire. In some embodiments, removing the detached defective wire can include shaking the packaging substrate.

In some embodiments, the defective wire includes at least one of an extraneous wire, a wire having an erroneous diameter, a wire having a defective loop, and an erroneously positioned wire.

In some implementations, a method of manufacturing a module can include receiving by an automated wire cutting apparatus a packaging substrate having a die mounted thereon and a defective wire coupled thereto. The method further includes moving one or both of a wire cutting instrument of the wire cutting apparatus and the packaging substrate relative to the other based on predetermined instructions to effect mechanical separation of the defective wire from the packaging substrate using the wire cutting instrument.

In some embodiments, the predetermined instructions can be based at least in part on a pattern of defective wires coupled to the packaging substrate.

In some embodiments, the method can further include selecting by the automated wire cutting apparatus the predetermined instructions based at least in part on a pattern of defective wires coupled to the packaging substrate.

In some embodiments, moving one or both of the wire cutting instrument and the packaging substrate includes moving the wire cutting instrument relative to the packaging substrate.

In some embodiments, the method can further include contacting the defective wire and applying a shear force to the defective wire using the wire cutting instrument to effect the mechanical separation of the defective wire from the packaging substrate.

In some embodiments, the method can further include removing the separated defective wire. In some embodiments, removing the separated defective wire can include shaking the packaging substrate.

In some embodiments, the defective wire includes at least one of an extraneous wire, a wire having an erroneous diameter, a wire having a defective loop, and an erroneously positioned wire.

According to some teachings, the present disclosure relates to a wire cutting apparatus. The wire cutting apparatus includes a packaging substrate receptacle configured to receive a packaging substrate having a die mounted thereon and a defective wire coupled thereto. The wire cutting apparatus further includes a wire cutting instrument, the apparatus being configured to move one or more of the packaging substrate received in the packaging substrate receptacle and the wire cutting instrument to contact the defective wire to effect separation of the defective wire from the packaging substrate, such that a pattern of movement of the wire cutting instrument is based at least in part on a pattern of defective wires coupled to the packaging substrate.

In some embodiments, the wire cutting apparatus can be configured to select the predetermined instructions based on the pattern of defective wires.

In some embodiments, the wire cutting instrument can include a shear tool configured to contact the defective wire and apply a shear force upon the defective wire to effect separation of the defective wire from the packaging substrate.

In some embodiments, the apparatus can further include a packaging substrate shaker configured to shake the packaging substrate to remove detached defective wires.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 2 shows another example of a module manufacturing process.

FIG. 3 shows an example of an automated wire cutting apparatus.

FIGS. 5A and 5B show an example of separating a set of double wires from a packaging substrate.

FIGS. 6A and 6B show an example of separating a single defective wire from a packaging substrate.

DETAILED DESCRIPTION OF SOME EMBODIMENTS

Figure 1:
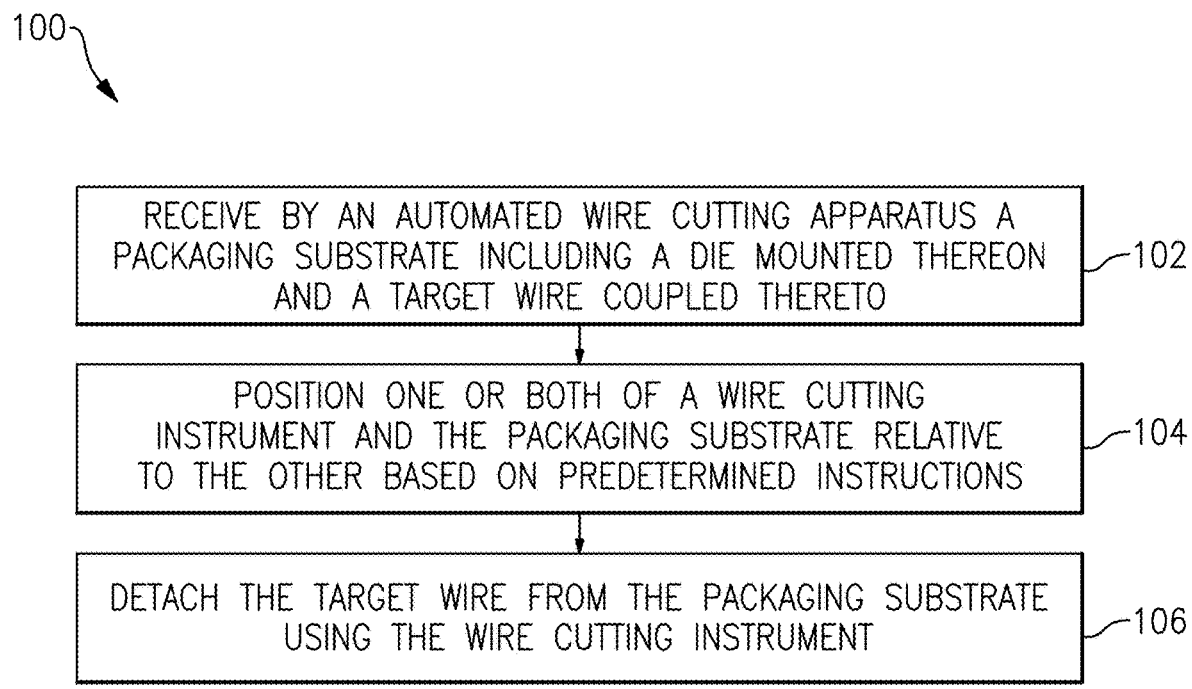
FIG. 1 shows an example of a module manufacturing process.

The headings provided herein, if any, are for convenience only and do not necessarily affect the scope or meaning of the claimed invention.

In the fabrication of electronic modules, the ability to provide desired removal of electrical wires bonded to packaging substrates can enable reuse of the packaging substrates. Different electrical wires can be bonded to the packaging substrates in place of the removed electrical wires such that the packaging substrates can be reused. Reuse of the packaging substrates can, for example, facilitate reduced waste and improved cost of manufacturing. The removed electrical wires may or may not comprise a defect. In some cases, non-defective wires can be replaced to enable performance testing of different wires using the same packaging substrate. In some cases, the removed electrical wires can be defective. For example, the removed electrical wires can be incorrectly bonded to packaging substrates and/or can have one or more incorrect parameters (e.g., leading to undesired electrical, physical and/or thermal performance). Without desired removal of electrical wires from the packaging substrates, including defective wires unintentionally bonded to packaging substrates, the packaging substrates cannot be reused and may need to be scraped, contributing to increased waste and cost of manufacturing.

Described herein are various examples of methods and apparatuses related to detachment of wires, including defective wires, from packaging substrates, and removal of the detached wires. The wires can comprise a variety of materials. For example, the wires can be gold wires and/or copper wires. In some cases, the methods and apparatuses described herein can achieve desired detachment and removal of defective and/or non-defective wires from packaging substrates, without or substantially without damaging the packaging substrate and/or electronic components coupled to the packaging substrate. For example, the wires can be detached and removed without or substantially without damaging dies mounted on the packaging substrate. In some embodiments, the wires can be detached and removed without or substantially without damaging other wires coupled to the packaging substrate. Reducing or eliminating damage to the packaging substrate, electronic components and/or other wires coupled to the packaging substrate can enable repeated use of the packaging substrates. Packaging substrates having defective wires coupled thereto can be recovered. Rather than discarding the packaging substrates with defective wires, methods and apparatuses described herein can enable detachment and removal of the defective wires such that replacement wires exhibiting desired characteristics can be bonded in their place. Packaging substrates can be reused for testing performances of different non-defective wires. Methods and apparatuses described herein can allow the packaging substrates to be salvaged for repeat use, thereby increasing fabrication yield and decreasing waste, and providing manufacturing cost savings.

Methods and apparatuses described herein can enable automated detachment of one or more wires coupled to a packaging substrate, and/or automated removal of the one or more detached wires therefrom. In some embodiments, the detachment and removal can be a fully automated process. For example, in response to an initial trigger, such as an initial user input from an operator, an automated wire cutting apparatus can detach and remove defective wires coupled to a packaging substrate without needing further instructions from the operator. In some embodiments, the initial trigger may not include a user input. For example, the initial trigger can comprise an indication of the receipt of the packaging substrate. In some embodiments, the detachment and removal can be a partially automated process. For example, an automated wire cutting apparatus can require additional user input after the initial trigger. The automated processes can provide increased manufacturing efficiency and reliability, further improving yield and cost savings.

Defective wires can have one or more undesired characteristics. As used herein, defective wires can refer to wires having one or more of the following features: an incorrect distribution of wire bonds, a misplaced bond, a defective wire loop, an incorrect wire size, an extraneous wire, and deviations in a bond due to variations in the solder mask. The defective wires can have one or more other physical defects. Although the description herein primarily refers to detachment and removal of defective wires, it will be understood that the methods and apparatuses can be applied to detachment and removal of wires without any defects. In some cases, wires without any defects can be replaced to provide performance comparison of different wires using the same packaging substrate. For example, different electrical wires can be bonded to the packaging substrate for determining electrical and/or thermal performances of the different electrical wires.

Referring to FIG. 1, an example of a module manufacturing process 100 is shown. The module manufacturing process 100 can be performed by one or more automated wire cutting apparatuses described herein. In block 102, a packaging substrate including a die mounted thereon and a target wire coupled thereto can be received by an automated wire cutting apparatus. In some embodiments, the target wire can be a defective wire. The defective wire can have one or more undesired characteristics. In some embodiments, the defective wire can be an extraneous wire, a wire having an erroneous diameter, a wire having a malformed loop, a wire including an incorrect distribution of wire bonds and/or an erroneously positioned wire. The defective wire can have one or more other defects, such as a misplaced bond and/or a defective bond to the packaging substrate, including irregular bonds formed due to variations in the solder mask.

The automated wire cutting apparatus can have one or more wire cutting instruments configured to facilitate detachment of the defective wire from the packaging substrate. In block 104, one or both of the wire cutting instrument of the automated wire cutting apparatus and the packaging substrate can be positioned relative to the other based on predetermined instructions. The predetermined instructions can include instructions for the movement of the wire cutting instrument and/or the packaging substrate. The predetermined instructions can be based at least in part on a pattern of target wires, such as a pattern of the defective wires, attached to the packaging substrate. For example, the predetermined instructions can be based at least in part on where the defective wire is located on the packaging substrate. The predetermined instructions can include instructions which direct movement of one or both of the wire cutting instrument and the packaging substrate such that the wire cutting instrument and the packaging substrate can be positioned relative to one another to facilitate subsequent detachment of the defective wire. Movement of one or both of the wire cutting instrument and the packaging substrate can be predetermined in view of where the defective wire is located on the packaging substrate. In some embodiments, the wire cutting instrument and/or the packaging substrate can be moved to position the wire cutting instrument adjacent or proximate to the defective wire. For example, the wire cutting instrument can be positioned to be in contact with the defective wire to facilitate subsequent detachment of the defective wire.

The automated wire cutting apparatus can be configured to select a set of predetermined instructions based at least in part on the pattern of defective wires coupled to the packaging substrate. In some embodiments, the automated wire cutting apparatus can be configured to select the predetermined instructions from a plurality of sets of predetermined instructions. For example, a particular set of predetermined instructions can correspond to a particular pattern of defective wires. The automated wire cutting apparatus can then execute the selected predetermined instructions to achieve desired placement of the wire cutting instrument and the packaging substrate.

The automated wire cutting apparatus can receive a user input which includes an indication of the pattern of defective wires on the packaging substrate. The user input can be entered locally at the automated wire cutting apparatus and/or received from a remote source, such as via wireless communication. In response to the user input, the automated wire cutting apparatus can select a set of predetermined instructions from the plurality of sets of predetermined instructions. In some embodiments, the automated wire cutting apparatus can obtain an indication of the pattern of defective wires through a means other than a user input. For example, any received user input can include a trigger to initiate a process without including any indication of the pattern of defective wires. The automated wire cutting apparatus can be configured to then determine the pattern of defective wires without a user input indication. In some embodiments, the automated wire cutting apparatus can detect the pattern of defective wires by scanning a serial number, a bar code, and/or reading any other type of label indicative of the pattern of defective wires. The label can be present on the packaging substrate and/or on a receptacle configured to hold the packaging substrate. In some embodiments, the automated wire cutting apparatus can detect the pattern of defective wires through an optical detection method in which the pattern of defective wires can be directly determined by the apparatus. For example, the automated wire cutting apparatus can have a pattern recognition component configured to detect the pattern of defective wires.

In some embodiments, the wire cutting instrument is moved relative to the packaging substrate while the packaging substrate is held in a stationary or substantially stationary position. The wire cutting instrument can be moved to achieve desired positioning of the wire cutting instrument relative to the packaging substrate such that wire cutting instrument can be used to contact the defective wire and detach the defective wire. For example, the packaging substrate can be placed at a target position and/or orientation by the automated wire cutting apparatus. The packaging substrate can then be held in the target position and/or orientation while the automated wire cutting apparatus executes the predetermined instructions to move the wire cutting instrument relative to the packaging to enable subsequent detachment of the defective wire. In some embodiments, the packaging substrate is moved relative to the wire cutting instrument while the wire cutting instrument is held in a stationary position. For example, the wire cutting instrument can be placed at a target position and/or orientation by the automated wire cutting apparatus. The wire cutting instrument can be held in the target position and/or orientation while the packaging substrate is moved relative to the wire cutting instrument to enable detachment of one or more defective wires. In some embodiments, both the packaging substrate and the wire cutting instrument can be moved relative to the other to achieve desired positioning of the wire cutting instrument and the packaging substrate relative to one another such that wire cutting instrument can be used to contact the defective wire for detaching the defective wire.

In some embodiments, the automated wire cutting apparatus can execute the predetermined instructions to effect movement of the packaging substrate and/or wire cutting instrument along one or more linear or substantially linear paths to achieve desired positioning of the wire cutting instrument and the packaging substrate relative to one another. One or both of the wire cutting instrument and the packaging substrate can be moved along one or more linear or substantially linear paths based on the pattern of defective wires on the packaging substrate to achieve desired positioning of the wire cutting instrument and/or the packaging substrate relative to one another. For example, the wire cutting instrument can be moved directly forward, directly backward, directly to the left, and/or directly to the right relative to the packaging substrate. In some embodiments, in combination or in the alternative, the wire cutting instrument can be moved along a linear or substantially linear path in one or more intermediate directions relative to the packaging substrate. In some embodiments, the packaging substrate can be moved along a linear or substantially linear path, including directly forward, directly backward, directly to the left, and/or directly to the right relative to the wire cutting instrument. In combination or in the alternative, the packaging substrate can be moved along a linear or substantially linear path in one or more intermediate directions. In some embodiments, both the packaging substrate and the wire cutting instrument can be moved along a linear or substantially linear path.

In block 106, the defective wire can be detached from the packaging substrate using the wire cutting instrument. The automated wire cutting apparatus can execute the selected predetermined instructions to detach the defective wire from the packaging substrate. For example, after the wire cutting instrument and the packaging substrate have been placed at desired positions relative to one another, the wire cutting instrument can be moved relative to the packaging substrate (e.g., along a linear or substantially linear path directly forward from, directly backward from, directly to the left of, and/or directly to the right of the packaging substrate) to detach the defective wire. In some embodiments, movement of the wire cutting instrument can allow the wire cutting instrument and the defective wire to come into physical contact with one another to enable separation of the defective wire from the packaging substrate. In some embodiments, the wire cutting instrument and the packaging substrate are already in contact with one another, and the wire cutting instrument can be moved relative to the packaging substrate to achieve the detachment. Contact between the wire cutting instrument and the defective wire can be maintained desired detachment is achieved. For example, contact can be maintained until sufficient shear force is applied upon the defective wire to physically separate both ends of the defective wire from the packaging substrate. For example, the wire cutting instrument can be used to apply a mechanical force upon the defective wire until the defective wire completely detaches from the packaging substrate. In some embodiments, the packaging substrate can be moved relative to the wire cutting instrument to achieve separation of the defective wire from the packaging substrate.

One or more portions of the module manufacturing process 100 can be repeated to detach a plurality of defective wires from a packaging substrate. In some embodiments, the packaging substrate can include a plurality of defective wires coupled thereto. The predetermined instructions can include instructions to move one or both of the wire cutting instrument and the packaging substrate to facilitate detachment and removal of all of the defective wires from the packaging substrate. The predetermined instructions can be based at least in part on locations of all of the defective wires which are coupled to the packaging substrate, such as a pattern of all of the defective wires coupled to the packaging substrate. Movement of one or both of the wire cutting instrument and the packaging substrate can be predetermined in view of where the plurality of defective wires are attached to the packaging substrate. The predetermined instructions can include instructions which direct movement of one or both of the wire cutting instrument and the packaging substrate so as to position the wire cutting instrument and/or the packaging substrate relative to one another to enable sequential detachment of the plurality of defective wires. For example, after a first defective wire is detached, the wire cutting instrument and/or the packaging substrate can be moved relative to the other to achieve desired positioning of the wire cutting instrument and the packaging substrate relative to one another to facilitate detachment of a second defective wire. The second defective wire can then be detached. In some embodiments, the packaging substrate can be placed at a target position and/or orientation, and the wire cutting instrument can be moved relative to the packaging substrate to sequentially detach all of the defective wires. The packaging substrate may only need to be placed at the target position and/or orientation once in order for all of the defective wires to be detached.

FIG. 2 shows another example of a module manufacturing process 200. The module manufacturing process 200 can be performed by one or more automated wire cutting apparatuses, such as one or more of the automated wire cutting apparatuses described herein. In block 202, a packaging substrate having a die mounted thereon and a target wire coupled thereto can be received by an automated wire cutting apparatus. In some embodiments, the target wire can be a defective wire. The defective wire can have one or more defects as described herein. In some embodiments, the defective wire can be an extraneous wire, a wire having an erroneous diameter, a wire having a malformed loop, and/or an erroneously positioned wire. In some embodiments, the defective wire can include an incorrect distribution of wire bonds and/or an erroneously positioned wire. In some embodiments, the defective wire can have one or more defective bonds, such as a misplaced bond and/or an abnormal bond formed due to variations in the solder mask.

The automated wire cutting apparatus can have one or more wire cutting instruments configured to facilitate detachment of the defective wire from the packaging substrate. In block 204, one or both of a wire cutting instrument and the packaging substrate can be moved relative to the other based on predetermined instructions to effect mechanical separation of the defective wire from the packaging substrate using the wire cutting instrument.

As described herein, the predetermined instructions can be based at least in part on a pattern of defective wires coupled to the packaging substrate. The automated wire cutting apparatus can select the predetermined instructions based at least in part on a pattern of defective wires coupled to the packaging substrate. The automated wire cutting apparatus can select the predetermined instructions from a plurality of sets of predetermined instructions. In some embodiments, the pattern of defective wires can be provided to the automated wire cutting apparatus via a user input. In some embodiments, the automated wire cutting apparatus can be configured to detect the pattern of defective wires. The selected predetermined instructions can be executed by the automated wire cutting apparatus to move the wire cutting instrument and/or the packaging substrate to achieve desired positioning of the wire cutting instrument and/or the packaging substrate. In some embodiments, the wire cutting instrument is moved relative to the packaging substrate to achieve the desired positioning, while the packaging substrate is held in a stationary or substantially stationary position. In some embodiments, the packaging substrate is moved, while the wire cutting instrument is stationary or substantially stationary. In some embodiments, both the packaging substrate and the wire cutting instrument can be moved relative to the other. As described herein, to achieve the desired positioning of the wire cutting instrument and the packaging substrate prior to detachment of the defective wire, one or both of the wire cutting instrument and the packaging substrate can be moved along one or more linear or substantially linear paths. The way in which the wire cutting instrument and/or packaging substrate is moved can be based on the pattern of defective wires on the packaging substrate. In some embodiments, the wire cutting instrument can be moved directly forward, directly backward, directly to the left, and/or directly to the right, relative to the packaging substrate, based on the pattern of defective wires. In some embodiments, in combination or in the alternative, the wire cutting instrument can be moved along a linear or substantially linear path in one or more intermediate directions relative to the packaging substrate.

After the wire cutting instrument and the packaging substrate are at desired positions relative to one another, the wire cutting instrument and/or the packaging substrate can be moved to effect detachment of the defective wire. For example, the wire cutting instrument and the defective wire can be in contact with one another such that a shear force can be exerted upon the defective wire. Contact between the wire cutting instrument and the defective wire can be maintained while one or both of the wire cutting instrument and the packaging substrate are moved relative to the other until sufficient shear force is applied to the defective wire to mechanically separate both ends of the defective wire from the packaging substrate.

One or more portions of the module manufacturing process 200 can be repeated to detach a plurality of defective wires from a packaging substrate. The predetermined instructions can include instructions to move one or both of the wire cutting instrument and the packaging substrate to facilitate sequential detachment and removal of all of the defective wires from the packaging substrate. The predetermined instructions can be based at least in part on locations of all of the defective wires which are coupled to the packaging substrate, such as a pattern of all of the defective wires coupled to the packaging substrate. For example, after a first defective wire is detached, the wire cutting instrument and/or the packaging substrate can be moved relative to the other to achieve desired positioning of the wire cutting instrument and the packaging substrate relative to one another to facilitate detachment of a second defective wire. The second defective wire can then be detached. In some embodiments, after the packaging substrate is placed at a target position and/or orientation, the wire cutting instrument can be moved relative to the packaging substrate to sequentially detach all of the defective wires.

In some embodiments, detached defective wires can be removed for disposal. For example, any detached defective wires can be removed from surfaces of the packaging substrate and discarded. The defective wires can be detached using the module manufacturing process 100 or the module manufacturing process 200. After the defective wires are detached, the packaging substrate can be vibrated to remove loose detached defective wires. In some embodiments, the automated wire cutting apparatus can be configured to cause the packaging substrate to vibrate such that any loose defective wires separated from the packaging substrate can be removed from being in contact with the packaging substrate. For example, the packaging substrate can be shaken by the automated wire cutting apparatus until all loose detached defective wires are no longer in contact with any of the surfaces of the packaging substrate.

After removal of detached defective wires, the packaging substrate can be subjected to further processing. For example, packaging substrates which have had defective wires detached and removed can be returned to an operator for subsequent processing, such as to bond replacement wires in place of the detached defective wires.

As described in further detail herein, one or more processes, and/or portions of processes described herein can be automated. For example, one or more processes, and/or portions of processes described herein can be automatically performed by an automated wire cutting apparatus in response a user input, without needing further operator interference after the initial user input. In some embodiments, the module manufacturing process 100 and/or the loose detached defective wire removal process can be performed by an automated wire cutting apparatus in response a user input triggering initiation of the process 100 without needing further operator interference. In some embodiments, the module manufacturing process 200 and/or the loose detached defective wire removal process can be performed by an automated wire cutting apparatus in response a user input triggering initiation of the process 200 without needing further operator interference.

The processes described herein, such as the module manufacturing process 100, the module manufacturing process 200, and/or the process for removal of loose detached defective wires, can be repeated with each packaging substrate of a plurality of packaging substrates having defective wires coupled thereto.

FIG. 3 shows an example of an automated wire cutting apparatus 300. The automated wire cutting apparatus 300 can include a user input terminal 302 configured to receive various inputs from an operator. User input can include an indication of a pattern of defective wires coupled to a packaging substrate to be processed by the automated wire cutting apparatus 300 and/or various other parameters used to operate one or more components of the automated wire cutting apparatus 300. In some embodiments, the user input can include indications of a plurality of patterns of defective wires. As described herein, the automated wire cutting apparatus can be used to process a plurality of packaging substrates. The plurality of packaging substrates can have the same pattern of defective wires or different patterns of defective wires. The user input can include indications of the same pattern of defective wires or the different patterns of defective wires.

User input received at the user input terminal 302 can trigger initiation of one or more processes described herein. For example, the automated wire cutting apparatus 300 can select a particular set of predetermined instructions stored in a memory associated with the automated wire cutting apparatus 300, in response to a user input received at the user input terminal 302. The predetermined instructions can include instructions to direct the automated wire cutting apparatus 300 to perform one or more processes described herein so as to achieve detachment and/or removal of one or more defective wires. The memory associated with the automated wire cutting apparatus 300 can store many sets of predetermined instructions. The memory associated with the automated wire cutting apparatus 300 can be a local memory. In some embodiments, the predetermined instructions are stored in a memory remote from the automated wire cutting apparatus 300 and the predetermined instructions are communicated to the automated wire cutting apparatus 300, such as via wireless communication.

In some embodiments, the automated wire cutting apparatus 300 can be configured to detect the pattern of defective wires coupled to a packaging substrate without a need for a user input indication. For example, the automated wire cutting apparatus 300 can have a defective wire pattern detector to detect the pattern of defective wires for each of a plurality of packaging substrates to be processed, or one representative packaging substrate of the plurality of packaging substrates. The automated wire cutting apparatus 300 can select corresponding predetermined instructions based on the detected patterns.

The automated wire cutting apparatus 300 can both select and execute the predetermined instructions in response to receiving an indication of the pattern of defective wires. In some embodiments, the wire cutting apparatus 300 can achieve desired wire detachment and removal without further operator interference and/or input after receiving the indication. In some embodiments, the wire cutting apparatus 300 can request for further operator interference and/or input after receiving the indication to achieve desired wire detachment and removal.

The automated wire cutting apparatus 300 can include a visual display 304. The visual display 304 can facilitate operation of the wire cutting apparatus 300, such as by allowing an operator to view various parameters relating to the operation of the automated wire cutting apparatus 300, including parameters relating to one or more processes described herein. The visual display 304 can facilitate entry of user input into the automated wire cutting apparatus 300. In some embodiments, the visual display 304 can allow viewing of parameters entered by an operator for future or current operation of the automated wire cutting apparatus 300. The visual display 304 can allow the operator to view a request for user input. In some embodiments, the visual display 304 may allow the user to view parameters and/or images of an ongoing wire detachment process. In some embodiments, the visual display 304 can present to the user of one or more features of a packaging substrate being processed by the automated wire cutting apparatus 300. For example, the visual display 304 can enable viewing of an entire packaging substrate or one or more portions thereof.

The automated wire cutting apparatus 300 can include a packaging substrate receiving port 306 through which a packaging substrate can be transferred. In some embodiments, the packaging substrate receiving port 306 can engage with and/or receive one or more packaging substrates which have defective wires coupled thereto. In some embodiments, the packaging substrate receiving port 306 can be configured to engage with and/or receive a packaging substrate retainer configured to hold one or more packaging substrates. For example, the packaging substrate receiving port 306 can be configured to interface with a packaging substrate retainer holding a plurality of packaging substrates. In some embodiments, receipt of the packaging substrate and/or packaging substrate retainer by the packaging substrate receiving port 306 can trigger initiation of one or more processes described herein. In some embodiments, selection of the appropriate predetermined instructions can be initiated in response to the receipt of the packaging substrate and/or packaging substrate retainer, without any further user input from an operator. In some embodiments, a detection of an indication of a pattern of defective wires and/or a request for the indication can be triggered in response to the receipt of the packaging substrate and/or packaging substrate retainer.

A packaging substrate can be transferred from a packaging substrate retainer to a packaging substrate receptacle within the automated wire cutting apparatus 300 via the packaging substrate receiving port 306. The packaging substrate receptacle can be configured to securely receive the packaging substrate. For example, after removal from the packaging substrate retainer, the packaging substrate can be positioned on and/or within a packaging substrate receptacle of the automated wire cutting apparatus 300 to facilitate manipulation of the packaging substrate by the apparatus 300. In some embodiments, the packaging substrate receptacle can facilitate desired movement of the packaging substrate by the automated wire cutting apparatus 300. In some embodiments, the packaging substrate receptacle can facilitate maintaining the packaging substrate at a desired position. For example, the packaging substrate receptacle can be configured to maintain the packaging substrate in a desired stationary or substantially stationary position while any defective wires are detached.

In some embodiments, each of a plurality of packaging substrates can be sequentially transferred from the packaging substrate retainer to the packaging substrate receptacle of the automated wire cutting apparatus 300 via the packaging substrate receiving port 306 for processing. Each of the plurality of packaging substrates can be sequentially positioned within the packaging substrate receptacle for processing by the automated wire cutting apparatus 300. For example, a subsequent packaging substrate can be transferred from the packaging substrate retainer into the automated wire cutting apparatus 300 after all defective wires have been detached and/or removed from a previous packaging substrate. In some embodiments, the packaging substrate can be transferred directly to the packaging substrate receptacle from the packaging substrate retainer. In other embodiments, one or more intermediates steps are performed.

The automated wire cutting apparatus 300 can have a wire cutting instrument 308 for facilitating detachment of defective wires from a packaging substrate. The wire cutting instrument 308 can be configured to contact a target defective wire coupled to the packaging substrate and apply a force upon the target defective wire to mechanically separate the target wire from the packaging substrate. In some embodiments, the wire cutting instrument 308 can be configured to maintain contact with the target defective wire until the wire is completely detached from the packaging substrate, such as when both ends of the wire have been detached. The wire cutting instrument 308 can have any number of configurations suited to contact and apply desired force upon defective wires to effect separation of the defective wires from a packaging substrate.

The wire cutting instrument 308 can have a wire cutting shank portion 310, and a wire cutting tip portion 312 extending from a distal end of the shank portion 310. For example, the wire cutting tip portion 312 can come into contact with the target defective wire and facilitate separation of the target defective wire from the packaging substrate. The wire cutting instrument 308 can have any number of configurations which enable separation of a target defective wire without or substantially without damaging the packaging substrate and other components coupled to the packaging substrate. For example, the wire cutting tip portion 312 can be tapered, and can be shaped and dimensioned to enable detachment of target defective wires without or substantially without damage to the packaging substrate and any other components coupled to the packaging substrate. In some embodiments, the wire cutting instrument 308 can be a die shear tool (e.g., a die shear tool commercially available from Nordson Dage Company, Aylesbury, Buckinghamshire, UK).

In some embodiments, the wire cutting tip portion 312 can contact one or more defective wires coupled to a packaging substrate while the packaging substrate is held by a packaging substrate receptacle. The wire cutting instrument 308 can be moved relative to the packaging substrate to enable the wire cutting tip portion 312 to contact the desired defective wire on the packaging substrate. The pattern of movement of the wire cutting instrument 308 relative to the packaging substrate can be based on the locations of the one or more defective wires coupled to the packaging substrate. Each of the one or more defective wires can be sequentially contacted by the wire cutting tip portion 321 while the packaging substrate is held by the packaging substrate receptacle.

In some embodiments, the automated wire cutting apparatus 300 can include a shaker configured to shake a packaging substrate and facilitate disposal of any detached defective wires therefrom. In some embodiments, as shown in FIG. 3, the automated wire cutting apparatus 300 can include a packaging substrate shaker receptacle 314 configured to receive the packaging substrate. In some embodiments, the packaging substrate shaker receptacle 314 can have a first clamp portion 316 and a second clamp portion 318 configured to contact opposing edges of the packaging substrate. The packaging substrate shaker receptacle 314 can sandwich the packaging substrate between the first clamp portion 316 and the second clamp portion 318. The packaging substrate can be positioned within the packaging substrate shaker receptacle 314 while the shaker causes the packaging substrate to vibrate such that any detached defective wires can be removed. Shaking of the packaging substrate can facilitate removal of loose detached defective wires from surfaces of the packaging substrate. The removed defective wires can be subsequently collected and disposed of, such as discarded into a waste container. For example, after detachment of defective wires using the wire cutting instrument 308, the packaging substrate can be positioned within the packaging substrate shaker receptacle 314 and shaken to remove loose detached wires. The packaging substrate free of loose detached defective wires can be further processed. As described in further detail herein, replacement wires can be bonded to the packaging substrate in place of the defective wires. In some embodiments, packaging substrates free of loose detached defective wires can be returned to the operator via the packaging substrate receiving port 306. For example, the packaging substrates can be returned to a packaging substrate retainer coupled to the packaging substrate receiving port 306 such that the operator can retrieve the packaging substrates.

The automated wire cutting apparatus 300 can be a high precision tool. The automated wire cutting apparatus 300 can be configured to detach and/or remove electrical wires from packaging substrates used for incorporation into electronic devices, including mobile electronic devices. The automated wire cutting apparatus 300 can be configured to execute the predetermined instructions to detach and remove defective wires from packaging substrates having dimensions suited for incorporation into various wired and wireless electronic devices, including any number of wireless communication devices. The automated wire cutting apparatus 300 can be configured to execute the predetermined instructions to detach and remove defective wires from packaging substrates without or substantially without damaging the packaging substrates and electronic components coupled thereto.

As used herein, "automated" can refer to a fully automated process or a partially automated process. In some embodiments, a fully automated process can include, in response to an initiation trigger, performance by the automated wire cutting apparatus the entirety of one or more processes described herein. In some embodiments, the initiation trigger can include a user input. In some embodiments, a fully automated process can include, in response a user input from an operator and without further interference from the operator, selection by an automated wire cutting apparatus of the appropriate predetermined instructions which include instructions to complete the detachment of any defective wires and removal of any loose detached defective wires from one or more packaging substrates, and return of the one or more packaging substrates to the operator, without needing further commands from the operator. For example, user input, such as user input received at the user input terminal 302, can trigger initiation of a fully automated process to process a plurality of packaging substrates. As described herein, the user input may include an indication of one or more patterns of defective wires corresponding to the one or more packaging substrates. In some embodiments, the automated wire cutting instrument can be configured to detect the one or more patterns of defective wires. In some embodiments, the initiation trigger may not include a user input. For example, the initiation trigger can include an indication of the receipt of the one or more packaging substrates at the packaging substrate receiving port 306. One or more processes described herein can be initiated and completed in response to the indication that a packaging substrate retainer is received at the packaging substrate receiving port 306, without requiring user input.

In some embodiments, an automated wire cutting apparatus can perform a partially automated process. In some embodiments, a partially automated process can include, in response an initiation trigger, performance by the automated wire cutting apparatus of one or more portions of one or more processes described herein. In some embodiments, the automated wire cutting apparatus can be configured to select and execute predetermined instructions including instructions to perform one or more, but not all, of detachment of defective wires, removal of loose detached defective wires from one or more packaging substrates, and return of the one or more packaging substrates to the operator, in response to an initiation trigger. As described herein, the initiation trigger may or may not include a user input. In some embodiments, a user input can indicate whether a fully or partially automated process is to be performed.

The methods and/or apparatuses described herein can enable detachment and removal of defective wires without or substantially without damaging dies mounted on the packaging substrate and other wires coupled to the packaging substrate. The dies can be used in various applications, including mobile applications. In some embodiments, the dies can be used in radio-frequency (RF) and related applications. For example, the dies can be incorporated into RF devices. In some embodiments, the methods and/or apparatuses described herein can enable recovery of 99% of the packaging substrates which have defective wires coupled thereto. The methods and/or apparatuses can thereby increase manufacturing yield, reduce or eliminate waste, and reduce costs of fabrication.

Figure 4:
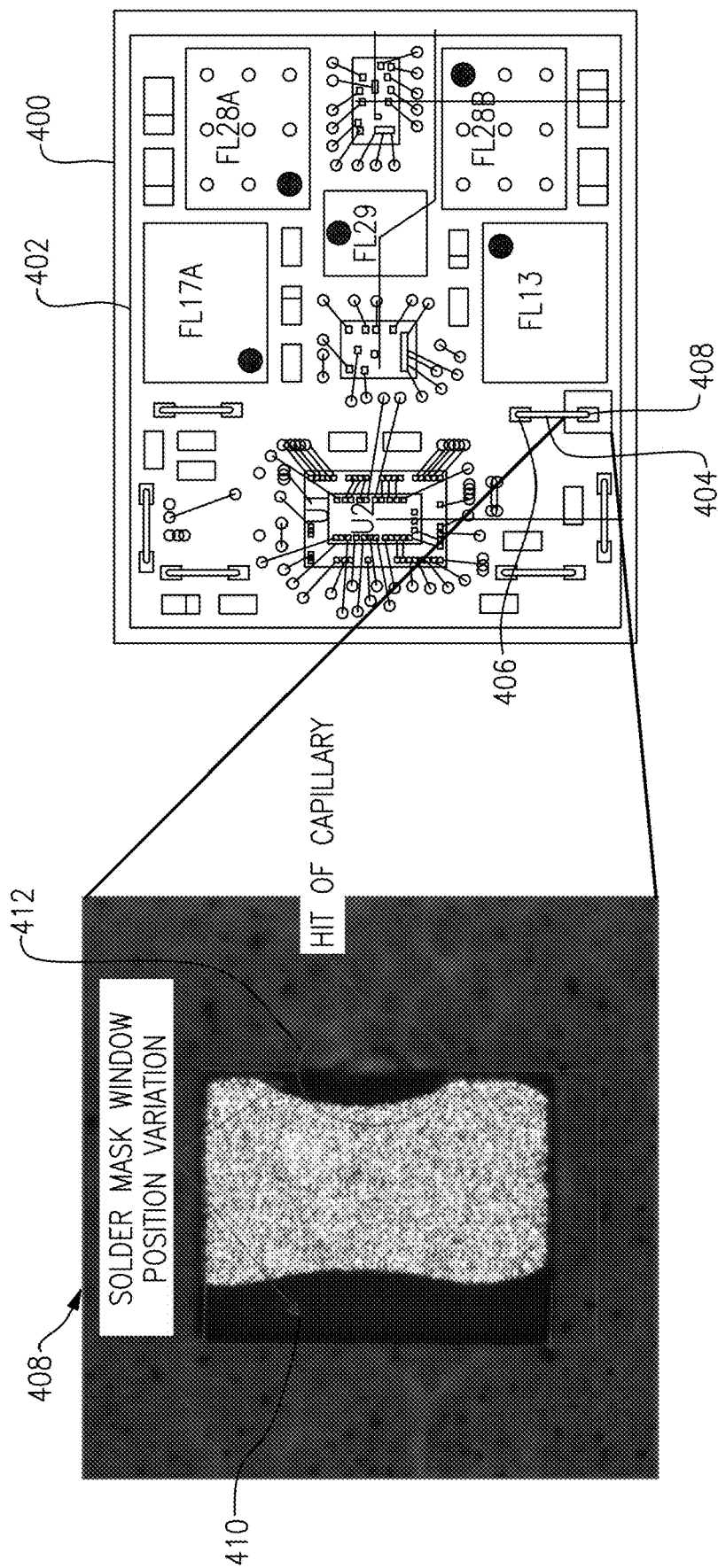
FIG. 4 shows an example of a defective wire coupled to a packaging substrate.

FIG. 4 shows an example of a defective wire 404 coupled to a packaging substrate 400. The packaging substrate 400 can have an electronic module 402 comprising a number of electronic components mounted thereon. For example, the electronic module 402 can be incorporated into any number of electronic devices, such as various wired and wireless electronic devices, including wireless communication devices. The electronic module 402 can be incorporated into devices for radio frequency (RF) and related applications. The electronic module 402 can include the defective wire 404 coupled to the packaging substrate 400. The defective wire 404 can be coupled to the packaging substrate 400 via a first end 406 and a second end 408. An enlarged view of the second end 408 is shown in FIG. 4. In the enlarged view, solder mask variation caused defects 410, 412 and a wire bonding capillary caused defect 414 at the second end 408 are shown. Defective bonding at the second end 408 can contribute to unsatisfactory electrical performance of the module 402. The defective wire 404 can be detached and removed from the packaging substrate 400 using one or more methods and/or apparatuses described herein. A properly bonded wire can subsequently replace the removed defective wire 404.

FIGS. 5A and 5B show an example of separating a set of double wires 502 from a packaging substrate 500, such as using one or more methods and/or apparatuses described herein. For example, the packaging substrate 500 can be held by a packaging substrate receptacle of an automated wire cutting apparatus, while the set of double wires 502 is detached from the packaging substrate 500. In FIG. 5A, the first end 504 of the set of double wires 502 is shown as being attached to the packaging substrate 500 at a first attachment 508 and a second end 506 of the set of double wires 502 as being attached to the packaging substrate 500 at a second attachment 510. In FIG. 5B, a wire cutting instrument 520 is positioned so as to contact the set of double wires 502 such that the first end 504 is detached from the packaging substrate 500. The wire cutting instrument 520 can have one or more features of the wire cutting instrument 308 as described with reference to FIG. 3. For example, the wire cutting instrument 520 can have a wire cutting tip portion 522 and a wire cutting shank portion 524. The wire cutting instrument 520 can contact the set of double wires 502 to apply a force upon the set of double wires 502 such that the first end 504 is decoupled from the packaging substrate 500. For example, the wire cutting tip portion 522 can come into contact with the double wires 502. The wire cutting instrument 520 can maintain contact with the set of double wires 502 such that the second end 506 is also detached from the packaging substrate 500, completely decoupling the set of double wires 502 therefrom. The wire cutting instrument 520 can be moved while maintaining contact with the set of double wires 502, and while the packaging substrate 500 is held stationary or substantially stationary (e.g., by the packaging substrate receptacle), until both the first end 504 and the second end 506 are detached, thereby separating the set of double wires 502 from the packaging substrate 500. The wire cutting instrument 520 can be moved along a linear or substantially linear path in a direction from the first attachment 508 toward the second attachment 510 while in contact with the set of double wires 502, until both the first end 504 and the second end 506 are detached.

FIGS. 6A and 6B show an example of separation of a single defective wire 602 from a packaging substrate 600. The separation can be achieved using one or more methods and/or apparatuses described herein. For example, the packaging substrate 600 can be held by a packaging substrate receptacle of an automated wire cutting apparatus, while the single defective wire 602 is detached from the packaging substrate 500. In FIG. 6A, the first end 604 of the single defective wire 602 is shown as being attached to the packaging substrate 600 at a first attachment point 608 and a second end 606 of the single defective wire 602 as being attached to the packaging substrate 600 at a second attachment point 610. In FIG. 6B, a wire cutting instrument 620 is shown as contacting the single defective wire 602 such that the first end 604 is detached from the packaging substrate 600. The wire cutting instrument 620 can have one or more features of the wire cutting instrument 308 described with reference to FIG. 3, such as a wire cutting tip portion 622 and a wire cutting shank portion 624. The wire cutting instrument 620, such as the wire cutting tip portion 622, can contact the single defective wire 602 to apply a force upon the single defective wire 602 such that the first end 604 is decoupled from the packaging substrate 600. The wire cutting instrument 620 can maintain contact with the single defective wire 602 until the second end 606 is also detached from the packaging substrate 600, thereby separating the single defective wire 602 from the packaging substrate 600. The wire cutting instrument 620 can be moved while maintaining contact with the single defective wire 602, and while the packaging substrate 600 is held stationary or substantially stationary, until both the first end 604 and the second end 606 are detached. For example, the packaging substrate 600 can be maintained in the desired position by the packaging substrate receptacle. The wire cutting instrument 620 can be moved along a linear or substantially linear path in a direction from the first attachment point 608 toward the second attachment point 610 while in contact with the single defective wire 602, until both the first end 604 and the second end 606 are detached.

Figure 7A:
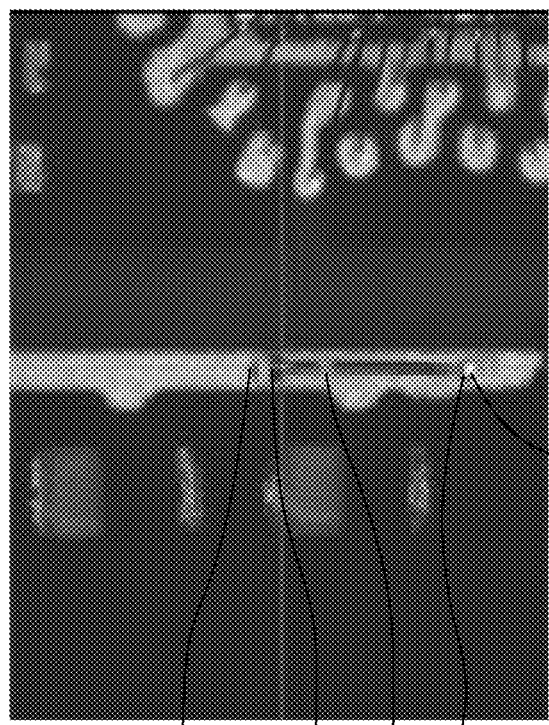
FIGS. 7A, 7B, 7C, 7D, 7E and 7F are images which show an example of a process in which a defective wire is removed from a packaging substrate using an automated wire cutting apparatus.
Figure 7B:
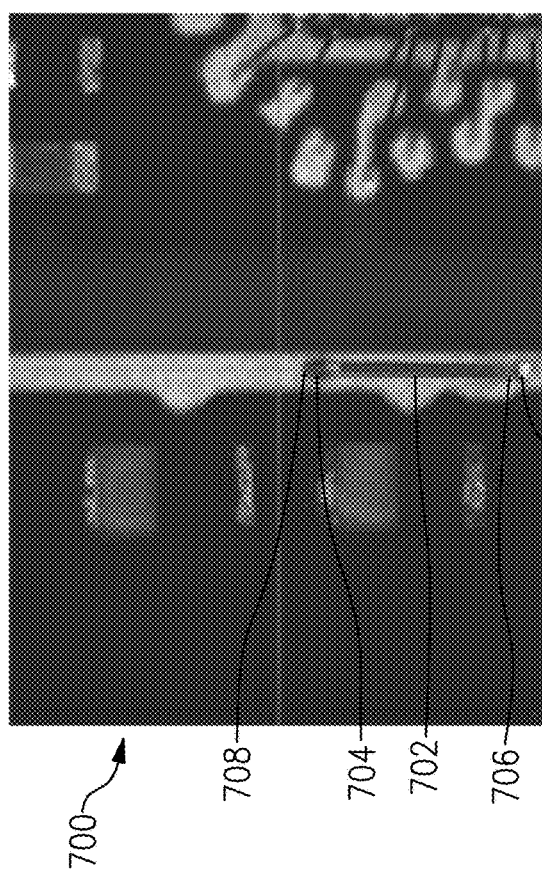

FIGS. 7A through 7F are images which show an example of a process in which a defective wire 702 is removed from a packaging substrate 700 using an automated wire cutting apparatus (e.g., automated wire cutting apparatus 300 as described with reference to FIG. 3). In FIG. 7A, the defective wire 702 is shown as being coupled to the packaging substrate 700 via a first end 704 and a second end 706 at a first attachment point 708 and a second attachment point 710 on the packaging substrate 700, respectively. A wire cutting instrument (not shown) of the automated wire cutting apparatus can be moved relative to a stationary or substantially stationary packaging substrate 700. The wire cutting instrument can contact the defective wire 702 such that a physical force can be applied upon the defective wire 702 to enable mechanical separation of the defective wire 702 from the packaging substrate 700. FIG. 7B shows the packaging substrate 700 after the wire cutting instrument has contacted the defective wire 702 and the first end 704 is detached from the first attachment point 708. The wire cutting instrument can come into contact with the defective wire 702 and maintain contact with the defective wire 702 while the wire cutting instrument is moved relative to the packaging substrate 700. Movement of the wire cutting instrument relative to the packaging substrate 700 can result in a force being applied upon the defective wire 702 to effect detachment of the first end 704. For example, the wire cutting instrument can maintain contact with the defective wire 702 while the wire cutting instrument is moved along a linear or substantially linear path in a direction from the first attachment point 708 toward the second attachment point 710. Movement of the cutting instrument can be continued until sufficient shear force is applied upon the defective wire 702 such that the first end 704 detaches from the first attachment point 708.

Figure 7D:
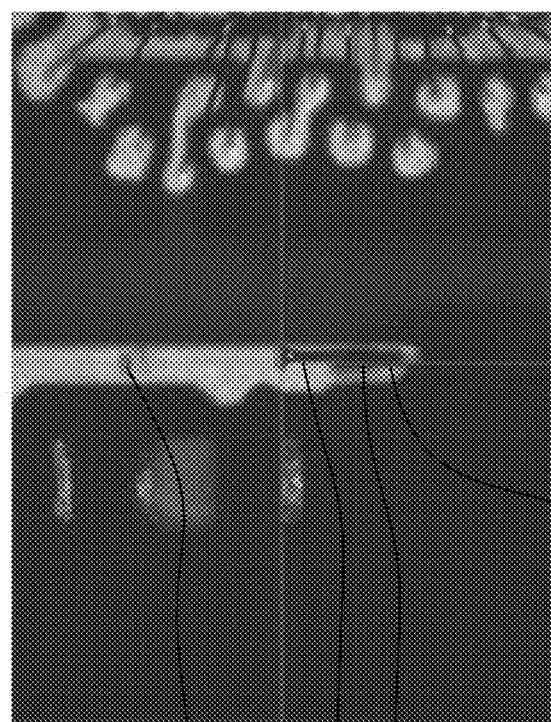
Figure 7C:
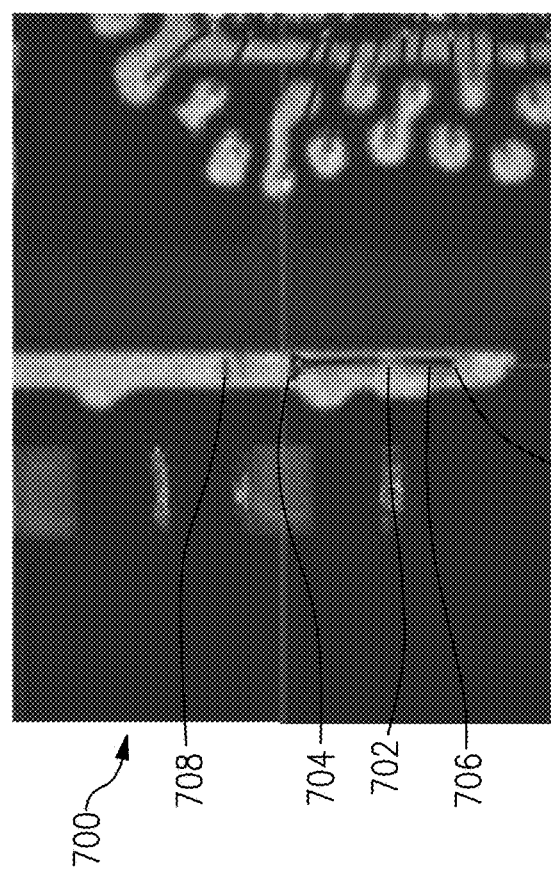
Figure 7F:
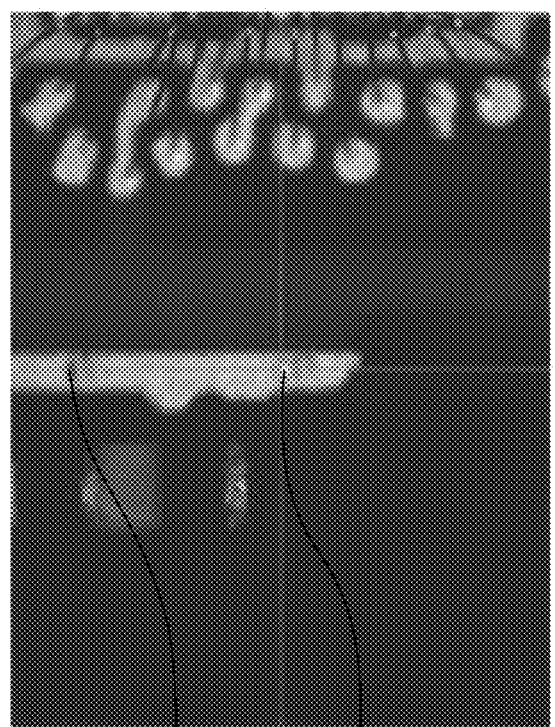
Figure 7E:
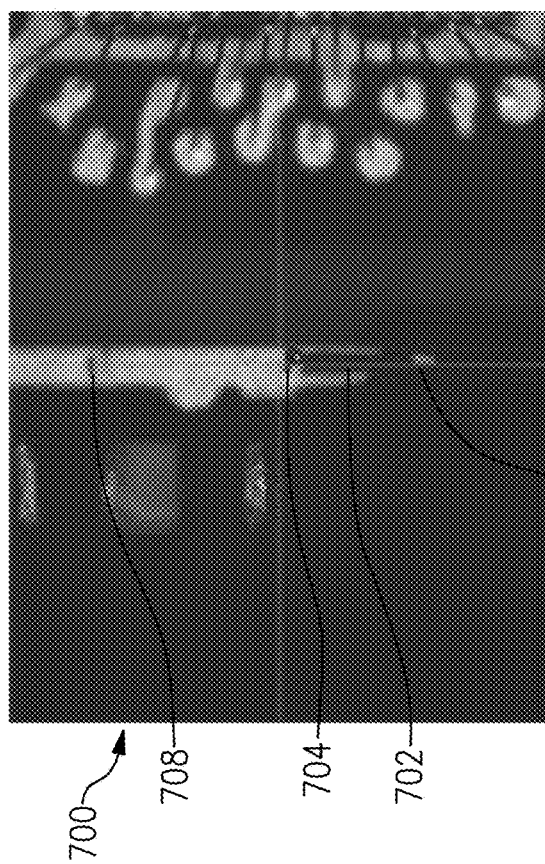

The wire cutting instrument can maintain contact with the defective wire 702 after the first end 704 is detached while movement of the wire cutting instrument is continued along the linear or substantially linear path. As shown in FIGS. 7C, 7D and 7E, the first end 704 is moved closer to the second end 706. The wire cutting instrument can be moved relative to the packaging substrate 700 and the wire cutting instrument can maintain contact with the defective wire 702 to move the first end 704 of the defective wire 702 closer to the second end 706. Movement of the wire cutting instrument can be continued along the linear or substantially linear path until the second end 706 of the defective wire 702 is also detached from the packaging substrate 700. For example, movement of the wire cutting instrument can be continued along the linear or substantially linear path until sufficient shear force is applied upon the defective wire 702 to effect detachment of the second end 706 from the second attachment point 710. In FIG. 7F, the defective wire 702 is no longer shown as it has been detached at the second end 706 from the second attachment point 710 as well, and the detached defective wire 702 has been removed. In some embodiments, the packaging substrate 700 can be vibrated so as to remove the defective wire 702 which has been detached.

As described herein, after the one or more defective wires are removed from a packaging substrate, the packaging substrate can be subjected to subsequent processing such that replacement wires can be bonded to the packaging substrate in place of the removed defective wires.

Figure 8:
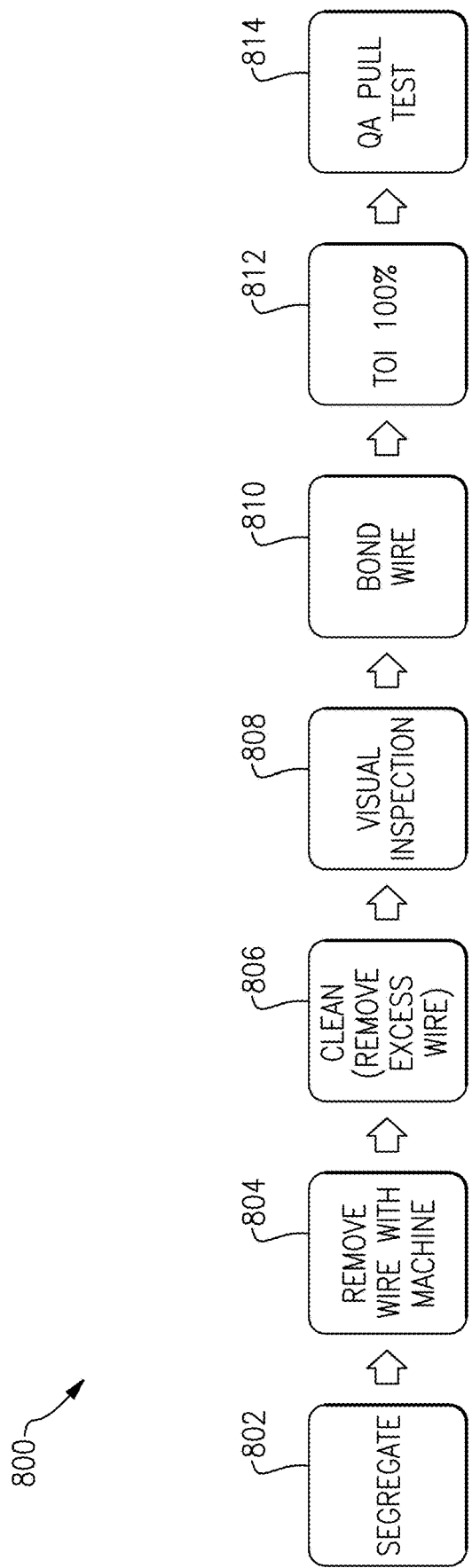
FIG. 8 shows an example of a packaging substrate recovery process.

Referring to FIG. 8, an example of a packaging substrate recovery process 800 is shown. The packaging substrate recovery process 800 can comprise one or more processes described herein to detach one or more defective wires from a packaging substrate, as well as subsequent processing of the packaging substrate to bond replacement wires in place of the removed defective wires. In block 802, one or more packaging substrates including one or more defective wires coupled thereto can be segregated from other packaging substrates. These packaging substrates can be identified and separated from packaging substrates which do not have defective wires coupled thereto. The identification can be performed manually (e.g., visual inspection by an operator) and/or by using an automated process (e.g., an inspection process performed by an automated tool).

In block 804, any defective wires can be detached from the one or more segregated packaging substrates. Detaching of the defective wires can be performed using one or more defective wire detachment processes described herein. In block 806, any loose detached defective wires can be removed from surfaces of a packaging substrate to provide a cleaned packaging substrate free of defective wires. In some embodiments, one or more processes described herein for removal of loose detached defective wires can be performed to provide a cleaned packaging substrate free of defective wires. One or more apparatuses described herein can be used to perform the detaching and/or removal of the defective wires. For example, a packaging substrate can be shaken by an automated wire cutting apparatus as described herein after defective wires coupled thereto are detached using the apparatus, so as to remove any loose detached defective wires.

In block 808, an inspection of cleaned packaging substrate can be performed, such as a visual inspection performed by an operator. The inspection can be performed to confirm that any loose detached defective wires have been removed from the packaging substrate. The inspected packaging substrates can be subjected to further processing to bond replacement wires to the packaging substrate. In block 810, replacement wires can be bonded to the packaging substrate in place of the removed defective wires. The replacement wire can correct a defective bond, and/or provide a correct wire having the desired features. The wire bonding can be performed using any number of commercially available wire bonders (e.g., wire bonder from Kulicke & Soffa Industries, Inc., Singapore, wire bonder from ASM Pacific Technology Ltd., Singapore).

Subsequent inspection and verification can be performed after the replacement wires are added to ensure electrical performance of the recovered packaging substrates. In block 812, an optical inspection can be performed to verify desired bonding of the replacement wires, such as a third optical inspection (TOI). In block 814, a quality control (QA) process can be performed to confirm desired electrical performance. These verification processes can be performed to confirm that correct replacement wires have been bonded in place of the detached defective wires to enable achievement of desired recovery of the packaging substrates.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of manufacturing a module, comprising:
  receiving by an automated wire cutting apparatus a packaging substrate including a die mounted thereon and a plurality of defective wires coupled thereto;
  receiving, by the automated wire cutting apparatus, a trigger for initiating execution of a set of stored instructions corresponding to a pattern of defective wires coupled to the packaging substrate for detaching the plurality of defective wires; and
  executing in response to the trigger, by the automated wire cutting apparatus without user input, the set of stored instructions to:
    position one or both of a wire cutting instrument of the automated wire cutting apparatus and the packaging substrate relative to the other, such that the wire cutting instrument is adjacent to a first defective wire of the plurality of defective wires, and
    detach the first defective wire, and sequentially detach remaining defective wires of the plurality of wires from the packaging substrate using the wire cutting instrument.

2. The method of claim 1 further comprising selecting by the automated wire cutting apparatus the set of stored instructions for the positioning and detaching based at least in part on the pattern of defective wires coupled to the packaging substrate.

3. The method of claim 1 wherein positioning one or both of the wire cutting instrument and the packaging substrate includes moving the wire cutting instrument relative to the packaging substrate.

4. The method of claim 1 wherein detaching the defective wire from the packaging substrate includes contacting the wire cutting instrument and the defective wire.

5. The method of claim 1 further comprising removing by the automated wire cutting apparatus the detached defective wire.

6. The method of claim 5 wherein removing the detached defective wire includes shaking the packaging substrate.

7. The method of claim 1 wherein the defective wire includes at least one of an extraneous wire, a wire having an erroneous diameter, a wire having a defective loop, and an erroneously positioned wire.

8. A method of manufacturing a module, comprising:
receiving by an automated wire cutting apparatus a packaging substrate having a die mounted thereon and a plurality of defective wires coupled thereto;
receiving, by the automated wire cutting apparatus, a trigger for initiating execution of a set of stored instructions corresponding to a pattern of defective wires coupled to the packaging substrate for detaching the plurality of defective wires; and
executing in response to the trigger and without user input, by the automated wire cutting apparatus, the set of stored instructions to move one or both of a wire cutting instrument of the wire cutting apparatus and the packaging substrate relative to the other, to sequentially effect mechanical separation of the plurality of defective wires from the packaging substrate using the wire cutting instrument.

9. The method of claim 8 further comprising selecting by the automated wire cutting apparatus the set of stored instructions for the moving based at least in part on the pattern of defective wires coupled to the packaging substrate.

10. The method of claim 8 wherein moving one or both of the wire cutting instrument and the packaging substrate includes moving the wire cutting instrument relative to the packaging substrate.

11. The method of claim 8 further comprising contacting the defective wire and applying a shear force to the defective wire using the wire cutting instrument to effect the mechanical separation of the defective wire from the packaging substrate.

12. The method of claim 8 further comprising removing by the automated wire cutting apparatus the separated defective wire.

13. The method of claim 12 wherein removing the separated defective wire includes shaking the packaging substrate.

14. The method of claim 8 wherein the defective wire includes at least one of an extraneous wire, a wire having an erroneous diameter, a wire having a defective loop, and an erroneously positioned wire.

15. A wire cutting apparatus comprising:
a packaging substrate receptacle configured to receive a packaging substrate having a die mounted thereon and a plurality of defective wires coupled thereto; and
a wire cutting instrument, the apparatus being configured to execute a set of stored instructions, in response to an initial trigger and without user input, to move one or more of the packaging substrate received in the packaging substrate receptacle and the wire cutting instrument to contact the defective wire to sequentially effect separation of the plurality of defective wires from the packaging substrate, the set of stored instructions corresponding to a pattern of defective wires coupled to the packaging substrate.

16. The wire cutting apparatus of claim 15 wherein the wire cutting apparatus is configured to select the set of stored instructions to move one or more of the packaging substrate and the wire cutting instrument based on the pattern of defective wires.

17. The wire cutting apparatus of claim 15 wherein the wire cutting instrument includes a shear tool configured to contact the defective wire and apply a shear force upon the defective wire to effect separation of the defective wire from the packaging substrate.

18. The wire cutting apparatus of claim 15 further comprising a packaging substrate shaker configured to shake the packaging substrate to remove detached defective wires.

* * * * *